United States Patent
Miura et al.

(10) Patent No.: US 8,326,387 B2
(45) Date of Patent: Dec. 4, 2012

(54) RE-TYPE OXIDE SUPERCONDUCTING WIRE AND PROCESS FOR PRODUCING THE SAME

(75) Inventors: Masashi Miura, Tokyo (JP); Tatsuhisa Nakanishi, Tokyo (JP); Yasunori Sutoh, Tokyo (JP); Teruo Izumi, Tokyo (JP); Yuh Shiohara, Tokyo (JP)

(73) Assignees: International Superconductivity Technology Center, The Juridical Foundation, Tokyo (JP); SWCC Showa Cable Systems Co., Ltd., Tokyo (JP)

( * ) Notice: Subject to any disclaimer, the term of this patent is extended or adjusted under 35 U.S.C. 154(b) by 350 days.

(21) Appl. No.: 12/811,141

(22) PCT Filed: Dec. 17, 2008

(86) PCT No.: PCT/JP2008/003812
§ 371 (c)(1),
(2), (4) Date: Jun. 29, 2010

(87) PCT Pub. No.: WO2009/087720
PCT Pub. Date: Jul. 16, 2009

(65) Prior Publication Data
US 2011/0124508 A1    May 26, 2011

(30) Foreign Application Priority Data
Jan. 8, 2008    (JP) ................. 2008-001443

(51) Int. Cl.
*H01L 39/24*    (2006.01)
(52) U.S. Cl. .................................. 505/230; 505/445
(58) Field of Classification Search .......... 505/230, 505/237, 238, 320, 434, 445, 470–480
See application file for complete search history.

(56) References Cited

U.S. PATENT DOCUMENTS

| | | |
|---|---|---|
| 2005/0159298 A1 | 7/2005 | Rupich et al. |
| 2006/0229211 A1 | 10/2006 | Moeckly et al. |
| 2007/0032384 A1* | 2/2007 | Foltyn et al. ................. 505/473 |
| 2008/0153709 A1* | 6/2008 | Rupich et al. ................ 505/230 |

(Continued)

FOREIGN PATENT DOCUMENTS
JP    2003-034527    2/2003
(Continued)

OTHER PUBLICATIONS

Supplementary European Search Report in corresponding European Application No. EP 08 86 9390, dated Jul. 25, 2012.

(Continued)

*Primary Examiner* — Colleen Dunn
(74) *Attorney, Agent, or Firm* — Bacon & Thomas, PLLC

(57) ABSTRACT

A RE-type oxide superconducting wire having excellent angular dependence for magnetic field of Jc is obtained by finely dispersing magnetic flux pinning centers into a superconductor. A mixed solution which comprises a metal-organic complex solution including a metal element which composes a RE-type oxide superconductor whose Ba content is reduced and a metal-organic complex solution including at least one or more kinds of metals which are selected from Zr, Ce, Sn, or Ti which has a larger affinity for Ba is coated onto an intermediate layer of a composite substrate, and the assembly is then calcined to disperse artificially and finely oxide particles (magnetic flux pinning centers) including Zr. Thus, the angular dependence for magnetic field ($Jc_{,min}/Jc_{,max}$) of Jc can be remarkably improved.

48 Claims, 4 Drawing Sheets

U.S. PATENT DOCUMENTS

2009/0270263 A1 10/2009 Aoki et al.

FOREIGN PATENT DOCUMENTS

| JP | 2003-300726 | 10/2003 |
| JP | 2004-203727 | 7/2004 |
| JP | 2006-062896 | 3/2006 |

OTHER PUBLICATIONS

Zhou et al., "Flux pinning in MOD YBCO films by chemical doping", Superconductor Science and Technology, vol. 20, No. 9, Sep. 1, 2007, pp. S147-S154.

Strickland et al., "Enhanced flux pinning by BaZrO3 nanoparticles in metal-organic deposited YBCO second-generation HTS wire", Physica C, vol. 468, No. 3, Dec. 3, 2007, pp. 183-189.

Izumi et al., "Progress in development of advanced TFA-MOD process for coated conductors", Physica C, vol. 463-465, Sep. 8, 2007, pp. 510-514.

Nakaoka et al., "Influence of starting solution composition on superconducting properties of YBCO coated conductors by advanced TFA-MOD process", Physica C, vol. 463-465, Sep. 8, 2007, pp. 519-522.

Gutierrez et al., "Strong isotropic flux pinning in solution-derived YBa2Cu3O7−x nanocomposite superconductor films", Nature Materials, vol. 6, No. 5, May 1, 2007, pp. 367-373.

S.V. Ghalsasi et al., "Enhancement of Current Carrying Capability in MOD-Processed YBCO Films Using Chemical Doping", IEEE Transactions on Applied Superconductivity, vol. 17, No. 2, Jun. 2007, pp. 3343-3346.

* cited by examiner

RE-TYPE OXIDE SUPERCONDUCTING WIRE AND PROCESS FOR PRODUCING THE SAME

TECHNICAL FIELD

This invention relates to a RE-type oxide superconducting wire and a process for producing the RE-type oxide superconducting wire which are useful to such as superconducting magnet, superconducting electric power cable, or electric power equipment. In particular, this invention relates to an improvement of the RE-type oxide superconducting wire and the process for producing the RE-type oxide superconducting wire which are able to utilize to the equipment which uses under the magnetic field such as the superconducting magnet among a superconducting applications.

BACKGROUND ART

In an oxide superconductor, because that critical temperature (Tc) exceeds the liquid nitrogen temperature, the applications for such as the superconducting magnet, the superconducting electric power cable, the electric power equipment and the device are expected, and many study results are informed.

In order to apply the oxide superconductor to the above-mentioned field, it is necessary to produce a long wire which has a high critical current density (Jc) and a high critical current value (Ic). On the other hand, in order to obtain a long wire, it is necessary to form the oxide superconductor onto a metallic substrate from viewpoint of strength and flexibility. Also, in order to enable use of the oxide superconductor at a practical level which is equivalent to the metallic superconductor such as $Nb_3Sn$ or $Nb_3Al$, the Ic value of about 500 A/cm (at 77K, in self-field) is required.

Besides, in the oxide superconductor, because the superconducting characteristic changes by that crystal orientation, it is necessary to improve the in-plane orientation for improving Jc, and it is necessary to form the oxide superconductor onto the tape-shaped substrate. For this reason, the film fabrication process that the oxide superconductor performs the epitaxial growth onto the high in-plane orientation substrate is adopted.

In this case, for improving Jc, it is necessary that the c axis of the superconductor is oriented perpendicular to the surface of the substrate, the in-plane orientation of the a axis (or the b axis) is conducted parallel to the surface of the substrate, and the quantum connectivity of the superconducting state is maintained well. For this reason, the improvements of the in-plane orientation and the azimuth of the crystal of the superconducting layer are conducted by forming the intermediate layer which improves the in-plane orientation and the azimuth onto the metallic substrate whose in-plane orientation is high, and by using the crystal lattice of this intermediate layer as the template. Besides, for improving Ic, it is necessary to thicken the film thickness of the oxide superconductor which is formed onto the substrate.

As the process for producing the tape-shaped RE-type oxide superconductor, that is, as the process for producing $REBa_2Cu_3O_z$ type oxide superconductor (here, RE means at least more than one kind of element selected from Y, Nd, Sm, Gd, Eu, Yb, Pt or Ho. Hereinafter called RE-type (123) superconductor.), MOD process (Metal Organic Deposition Processes) is known.

This MOD process makes metal organic acid salt decompose thermally. And after coating a solution that an organic compound which includes a metallic component which composes the superconductor solves uniformly onto the substrate, by heating this and then by making this decompose, the thin film is formed onto the substrate. This MOD process is non-vacuum process. Therefore, because the crystal growth of the film is possible at low cost and high speed, and because high Jc is obtained, there is an advantage that this process is suitable to produce the long tape-shaped oxide superconducting wire.

In MOD process, when the metal organic acid salt as starting material is decomposed thermally, the carbonate of alkali earth metal (Ba, etc.) is usually formed. However, in the formation of the oxide superconductor by a solid-phase reaction through this carbonate, the high temperature heat treatment more than 800 degrees C. is required. In addition, when the thick film is formed, because the nucleation for crystal growth occurs also from, parts other than the interface of the substrate, it is difficult to control the crystal growth rate. Consequently, there is a problem that it is difficult to obtain the superconducting film which has superior in-plane orientation, that is, the high Jc.

For solving the above-described problem in MOD process, as the process for producing the RE-type (123) superconductor without going through the carbonate, by using organic acid salt (for example, TFA salt: trifluoroacetate) including fluorine as the starting material, recently, the process for obtaining the superconductor through decomposition of fluoride by conducting the heat treatment under control of a water vapor partial pressure in a water vapor atmosphere is conducted vigorously.

In MOD process which uses this TFA salt as the starting material, by reaction between amorphous precursor including fluorine which is obtained after a preliminary calcination of the coating film and the water vapor, the epitaxial growth of the superconductor is conducted from the interface of the substrate by forming a liquid phase which is caused by HF in the interface that the superconducting film grows while HF gas occurs. In this case, because the decomposition speed of the fluoride can be controlled by the water vapor partial pressure during the heat treatment, the crystal growth rate of the superconductor can be controlled, consequently, the superconducting film which has the superior in-plane orientation can be produced. Besides, in this process, the epitaxial growth of the RE-type (123) superconductor can be conducted front the upper surface of the substrate at the comparatively low temperature.

Heretofore, for enabling the formation of the thick film and the high speed preliminary calcination process, the mass generation of HF gas in the preliminary calcination process is restrained by using the solution that TFA salt of Y and Ba and naphthenate of Cu are mixed in the organic solvent with the molar ratio of Y:Ba:Cu=1:2:3 as the starting materials.

As described above, when the tape-shaped oxide superconductor is produced by the MOD process, the formation of the thick film to improve the Ic value is essential for practical application. For accomplishing the formation of the thick film by MOD process when the starting material is TFA salt, there are thoughts that the viscosity of the raw material solution including TFA salt is increased and the coating film is thickened. However, when the thickness of the coating film per once becomes thick, because the quantity of gas generation of HF and $CO_2$ by decomposition in heat treatment increases, the phenomenon that the coating film is scattered in preliminary calcination occurs. Consequently, it is difficult to produce the thick film of the tape-shaped oxide superconductor which has the high characteristic.

For producing the thick film of the superconductor, the process for thickening the preliminary calcination film is considered by repeating the operations of the coating of the material and the preliminary calcination. However, in the above-mentioned heat treatment method by the preliminary calcination of conventional technology, because the rate of temperature rise which affects the decomposition speed of the metal organic acid salt in the heat treatment for preliminary calcination is fast, the decomposition of the metal organic acid salt including TFA salt is insufficient. Consequently, there is a tendency that the solvent or the organic acid salt remains in the film of the oxide superconductor precursor which is obtained by the preliminary calcination. Therefore, at the time of the temperature rise of the subsequent heat treatment for crystallization, the organic acid salt of the remaining such as fluoride decomposes rapidly, and such as the bumping evidence, the extraneous material, or pores are generated in the film. Besides, the stress occurs in the film by the volume shrinkage at the time of the decomposition of the preliminary calcination film and the formation of the crystal of YBCO (shown as Y-type (123) superconductor), and the cracks which originate on such as the bumping evidence, the extraneous material, or pores occur.

By repeating the coating and the preliminary calcination heat-treatment, this tendency becomes remarkable when the film of the oxide superconductor precursor of multilayer structure is formed and when the thick film is formed. Consequently, because the cracks remain as it is when crystallizing the obtained precursor thick film and when obtaining the superconducting film, the Jc characteristic deteriorates remarkably by disturbing the current pathway at the time of flowing the electric current.

For solving these problems, by controlling the rate of temperature rise in the preliminary calcination heat-treatment and by making the metal organic acid salt decompose sufficiently, the process to accomplish the high Jc and the formation of the thick film is known (for example, refer to Patent document No. 1).

Besides, by controlling the preliminary calcination heat-treatment temperature at the time of the heat treatment of the oxide superconductor precursor which is formed onto the substrate, and/or, by controlling the water vapor partial pressure of introduced gas in the atmosphere of the crystallization heat-treatment, the process for producing the tape-shaped oxide superconductor of the thick-film which has the high orientation and the high Jc is known (for example, refer to Patent document No. 2).

However, in the above-mentioned process which controls the rate of temperature rise in the preliminary calcination heat-treatment, or, in the above-mentioned process which controls the preliminary calcination heat-treatment, and/or, in the above-mentioned process which controls the water vapor partial pressure of introduced gas in the atmosphere of the crystallization heat-treatment, although the production of the thick film was achieved than before, the film thickness was limited to approximately 1.0 μm. And the cracks occurred when the film thickness reached approximately 1.5 μm even in the improved process of the crystallization heat-treatment, and therefore, it was difficult to obtain the thick film which had the high Jc and the high Ic.

From the subsequent study, the applicants which compose this application have knowledge that the deterioration of the Jc which accompanies such production of the thick film or the Ic which is lower than the value which is forecasted originates not only the occurrence of the cracks but also the deterioration of the electric connectivity of crystal grain boundary. And, the applicants filed ever the process for producing the thick film tape-shaped RE-type (123) superconductor which had the high Jc and the high Ic by removing or restraining the cause of such occurrence of the cracks and the deterioration of the electric connectivity of the crystal grain boundary (Application No. 2006-226421).

In this process, after coating the raw material solution including metal elements which compose the RE-type (123) superconductor onto the substrate, the preliminary calcination is given, and subsequently, the RE-type (123) superconductor is produced by giving the heat treatment for forming the superconductor. When the molar ratio of RE, Ba and Cu in the above-mentioned raw material solution is RE:Ba:Cu=1: y:3, the segregation of Ba can be restrained by reducing the molar ratio of Ba at the range of y<2, for example, within the range of $1.0 \leq y \leq 1.8$ (preferably $1.3 \leq y \leq 1.7$). Consequently, the occurrence of cracks is restrained by restraining the precipitation of the impurities of Ba base in the crystal grain boundary And, the electric connectivity among the grain boundaries improves, and then, the tape-shaped RE-type (123) superconductor which has the uniform thick film and the superior superconducting characteristic is produced easily with high speed by forming the superconducting film by MOD process.

However, in the tape-shaped RE-type (123) superconducting wire which is produced by the above-described TFA-MOD process, the grain boundary characteristic and the crystalline property of the superconductor are improved by controlling the component of the solution, and the improvement of the Jc at the self field, that is, the improvement of the Jc at 77K, 0 T (tesla) is confirmed. Nevertheless, the Jc in 77K, 1 T receives the affect of the angular dependence for magnetic field. Because the $Jc_{,min}$ is low at 0.19 MA/cm² and the angular dependence for magnetic field of the Jc shows the anisotropy at $Jc_{,min}/Jc_{,max}=0.47$, the introduction of the magnetic flux pinning centers is required into the superconductor for utilizing to the equipment which is used under the applied magnetic field.

As one process for solving this problem, the process which introduces the magnetic flux pinning centers into the superconductor by forming the $Y_{0.77}Sm_{0.23}Ba_{1.5}Cu_3O_z$ superconductor that a part of Y is substituted to Sm by using TFA-MOD process onto the substrate was tried. According to this process, the particulate Sm-rich phase ($Sm_{1+x}Ba_{2-x}Cu_3O_z$) which is the low-Tc phase is formed as the magnetic flux pinning centers into the superconductor, the angular dependence for magnetic field of Jc at 77K, 1 T is improved, and the anisotropy is improved at about 1.3 times with $Jc_{,min}/Jc_{,max}=0.6$. However, because the sizes of the magnetic flux pinning centers are large, the angular dependence for magnetic field of Jc is large as before.

Besides, according to S. V. Ghalsaki, etc., when forming $Y_{0.33}Sm_{0.66}Ba_2Cu_3O_z$ superconductor that a part of Y is substituted to Sm by using TFA-MOD process onto the $LaAlO_3$ single-crystalline substrate, the process which adds $BaZrO_3$ particles is reported (for example, refer to Non-patent document No. 1).

According to this process, although $BaZrO_3$ particles are added for forming the magnetic flux pinning centers, the film thickness is thin at about 0.2 μm, and Zr compound which forms the magnetic flux pinning centers is large at more than 30 nm, besides, the dispersion state is nonuniform. Therefore, the problem of the anisotropy is not solved.

On the other hand, according to J. GUTIERREZ, etc., when forming the YBCO superconductor onto SrTiO3 single-crystalline substrate by using TFA-MOD process, the process which adds $BaZrO_3$ salt is reported (for example, refer to Non-patent document No. 2).

According to this process, although $BaZrO_3$ salt is added for forming the magnetic flux pinning centers, the film thickness is also thin at about 0.2 μm, and Zr compound ($BaZrO_3$) which forms the magnetic flux pinning centers is large at more than 5-dozens nm, the dispersion state is nonuniform, besides Zr compound disperses at the neighborhood of the substrate intensively. Therefore, because the angular dependence for magnetic field of Jc at 77K, 1 T stays at $Jc_{,min}/Jc_{,max}=0.66$, also the problem of the anisotropy is not solved.

Patent document No. 1: Japanese Patent Publication No. 2003-300726
Patent document No. 2: Japanese Patent Publication No. 2003-34527
Non-patent document No. 1: IEEE TRANSACTIONS ON APPLIED SUPERCONDUCTIVITY, VOL. 17, No. 2, JUNE 2007
Non-patent document No. 2: nature materials/VOL 6/MAY 2007

DISCLOSURE OF THE INVENTION

Problem to be Solved by the Invention

As described above, in the superconducting wire, the high Jc (Ic) for every applied magnetic field angle is required for the application of the superconducting apparatus which is used under the applied magnetic field. For example, in the case of forming the solenoidal coil by the superconducting wire, for the substrate surface (superconducting surface) in both end parts of the coil, because the magnetic field is added at the angle that the Jc deteriorates, the value of the $Jc_{,min}$ becomes the rate-determining step in the design of the coil. This becomes the big problem for the application to the electric power equipment to such as the superconducting transformer or the SMES which is used under the high magnetic field.

Besides, in the superconductor, the density of the flux quantum which intrudes into the superconductor increases along with the increase of the applied magnetic field, and they move and the superconducting state destroys, and thereby, the Jc deteriorates. In addition, as described above, the superconductor has the characteristic that the Jc at the time of applying the magnetic field to the direction of a axis is low than the Jc at the time of adding the magnetic field to the direction of a axis by the cause of the crystal structure. Therefore, it is necessary that the nanosized magnetic flux pinning centers of the isotropic shape which is effective to every direction of the magnetic field for disturbing the movement of the quantized magnetic flux in the inside of the superconductor into the superconductor with nanometer distance uniformly is introduced. However, in TFA-MOD process, because the crystal grows by the phase transformation from the precursor unlike the vapor deposition, the introduced magnetic flux pinning centers become easy to coarse and the introduction of the fine artificial pinning centers is difficult.

This invention was conducted to solve the above problems, and by introducing the uniform and fine magnetic flux pinning centers into the superconductor which has thick film and is excellent to the grain-boundary property and the crystalline property, this invention aims to provide the RE-type oxide superconducting wire which is excellent to the angular dependence for magnetic field in the high magnetic field and this invention aims to provide the process for producing the RE-type oxide superconducting wire.

Means for Solving the Problems

For solving the above-mentioned problems, concerning the RE-type oxide superconducting wire of this invention, in the $REBa_yCu_3O_z$-type superconductor which is formed on the intermediate layer formed onto the substrate, any one kind of element which is selected from Y, Nd, Sm, Gd or Eu is used as RE. And, the molar ratio of Ba is within the range of y<2, besides, the oxide particles of 50 nm or less including Zr are dispersed as the magnetic flux pinning centers into the superconductor.

In the process for producing the $REBa_yCu_3O_z$-type superconductor by giving a preliminary calcination heat-treatment after coating a raw material solution on the intermediate layer formed onto the substrate, subsequently by giving a heat treatment for formation of a superconductor, a mixed solution which comprises a metal-organic complex solution including RE (RE shows one kind of metal element which is selected from RE=Y, Nd, Sm, Gd or Eu), Ba and Cu, and a metal-organic complex solution including at least one or more kinds of metals which are selected from Zr, Ce, Sn or Ti which has a larger affinity for Ba is used as the raw material solution. And, the molar ratio of Ba is within the range of y<2, besides, the oxide particles of 50 nm or less including Zr, Ce, Sn or Ti are dispersed as the magnetic flux pinning centers into the superconductor. Thereby, the above-mentioned RE-type oxide superconducting wire can be produced.

Besides, concerning the other RE-type oxide superconducting wire of this invention, in the $REBa_yCu_3O_z$-type superconductor which is formed on the intermediate layer formed onto the substrate, RE is the composition of RE=$A_{1-x}B_x$, and each A and B comprises any one or more kinds of different elements which are selected from Y, Nd, Sm, Gd or Eu. And, the molar ratio of Ba is within the range of y<2, besides, the oxide particles of 50 nm or less including Zr are dispersed as the magnetic flux pinning centers into the superconductor.

In the process for producing the $REBa_yCu_3O_z$-type superconductor by giving a preliminary calcination heat-treatment after coating a raw material solution on the intermediate layer formed onto the substrate, subsequently by giving a heat treatment for formation of a superconductor, a mixed solution which comprises a metal-organic complex solution including RE (RE has the composition of RE=$A_{1-x}B_x$, and each A and B shows any one or more kinds of different elements which are selected from Y, Nd, Sm, Gd or Eu.), Ba and Cu, and a metal-organic complex solution including at least one or more kinds of metals which are selected from Zr, Ce, Sn or Ti which has a larger affinity for Ba is used as the raw material solution. And, the molar ratio of Ba is within the range of y<2, besides, the oxide particles of 50 nm or less including Zr, Ce, Sn or Ti are dispersed as the magnetic flux pinning centers into the aforementioned superconductor. Thereby, the above-mentioned RE-type oxide superconducting wire can be produced.

In the above-mentioned RE-type oxide superconducting wire which has the composition of RE=$A_{1-x}B_x$ and the process for producing it, the composition of RE=$Y_{1-x}Sm_x$ is preferable. In this case, the oxide particles including Sin and the oxide particles of 50 nm or less including Zr can be dispersed as magnetic flux pinning centers into the superconductor.

In the above-described RE-type oxide superconducting wire and the process for producing it, it is preferable that the molar ratio of Ba is within the range of 1.3<y<1.8. By reducing the molar ratio of Ba than the standard molar ratio, the segregation of Ba is restrained, and the precipitation of the impurities of Ba base in the crystal grain boundary is restrained. Consequently, the occurrence of the cracks is restrained, and the electric connectivity among the crystal grain boundaries improves and the Jc which is defined by the conducting current improves. By reducing the molar ratio of Ba, $Y_2Cu_2O_5$ or CuO which is the magnetic flux pinning centers is formed, and the magnetic field characteristic is improved.

Although the oxide particles including Zr, Ce, Sn or Ti which are dispersed as the magnetic flux pinning centers which are introduced artificially into the superconductor are 50 nm or less, especially, the oxide particles including Zr of 5-30 nm are preferable In this case, when the composition of $Y_{1-x}Sm_x$ is used, as described above, the particulate Sm-rich phase ($Sm_{1+x}Ba_{2-x}Cu_3O_z$) which is the low-Tc phase is formed as the magnetic flux pinning centers into the superconductor, and the magnetic flux pinning centers are formed by the oxide particles including Sm and the oxide particles including Zr of 5-30 nm. Consequently, the pinning force improves remarkably.

It is preferable that the additive amount of Zr which is added for forming the magnetic flux pinning centers which are introduced artificially is 0.5-10 mol % with the metal concentration. When the additive amount of Zr is less than 0.5 mol %, because the density of the oxide particles is not sufficient, the sufficient pinning force in the high magnetic field cannot be obtained. On the other hand, when the additive amount of Zr exceeds 10 mol %, the precipitates become coarse, and the crystalline property deteriorates. Especially, the range of 0.5-5 mol % with the metal concentration is preferable.

Effect of the Invention

According to this invention, in the RE-type superconductor whose Ba concentration is reduced, the magnetic flux pinning centers including Zr can be dispersed finely and artificially into the superconductor. Thereby, the angular dependence for magnetic field of the Jc becomes small and the magnetic field characteristic which has the high Jc in the high magnetic field can be achieved, further, the angular dependence for magnetic field (Jc,min/Jc,max) also improves remarkably. Therefore, the magnetic flux can be pinned effectively for every direction of the applied magnetic field angle.

BEST MODE FOR CARRYING OUT THE INVENTION

Figure 4:
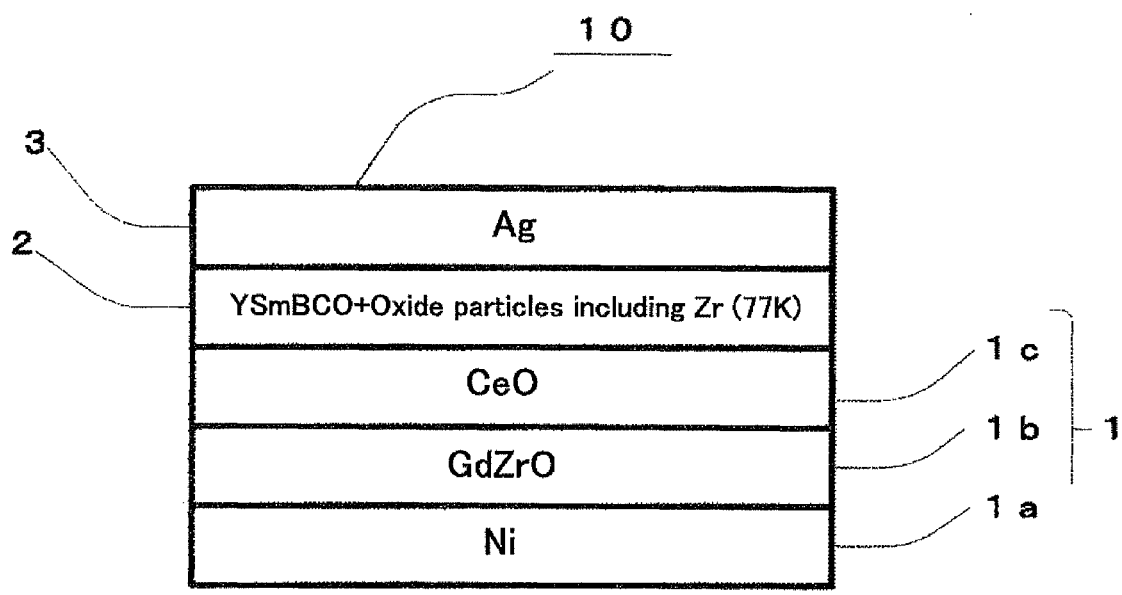
FIG. 4 The schematic view which shows the cross section perpendicular to the axial direction of the tape of the tape-shaped RE-type oxide superconducting wire which is produced by this invention.

FIG. 4 shows the cross section perpendicular to the axial direction of the RE-type oxide superconducting wire which is produced by this invention. The tape-shaped RE-type superconducting wire 10 has the cross section structure that the stabilizing layer 3 which comprises the RE-type superconducting layer 2 and such as Ag is formed onto the surface of the tape-shaped composite substrate 1.

As the above-mentioned composite substrate 1, the one which forms the intermediate layer onto the single-crystalline substrate of such as $LaAlO_3$ can be used, and in the production of the long wire, the one which forms the intermediate layer onto the oriented Ni substrate or the polycrystalline substrate such as the composite substrate which uses IBAD (Ion Beam Assisted Deposition) process can be used. In this IBAD composite substrate, onto the non-magnetic, high strength tape-shaped Ni-type substrate (such as hastelloy C276), while irradiating the ion for this Ni-type substrate from the diagonal direction, the high oriented intermediate layer which restrains the reaction with the elements which composes the superconductor which is formed by depositing the particles which are generated from the target is provided with one layer or two layers (refer to Japanese Patent Publication No. Hei4-329867, Japanese Patent Publication No. Hei4-331795).

In the composite substrate 1, as shown in this view, the composite substrate that the high oriented intermediate layer is formed onto the metallic substrate 1a such as Ni-base alloy with one layer or multiple layers, for example, the first intermediate layer 1b and the second intermediate layer 1c, is preferable. This first intermediate layer has the function as the buffer layer, and prevents the deterioration of the superconducting characteristic by restraining the reaction with the superconducting layer. On the other hand, the second intermediate layer is arranged for maintaining the consistency with the superconducting layer.

The RE-type superconducting layer 2, that is, $REBa_yCu_3O_z$-type superconducting layer is formed onto the composite substrate 1 that the intermediate layer of the two-layer structures is formed onto the above-mentioned, metallic substrate 1a.

The RE-type superconducting layer 2 is formed by the MOD process, and it is preferable that the mixed solution of the following (a)-(b) is used as the raw material solution.
(a) Metal-organic complex solution including RE: the solution which includes any one or more kinds of trifluoroacetate, naphthenate, octylic acid salt, levulinic acid salt, neodecanoic acid salt including RE. Especially trifluoroacetate solution including RE.
(b) Metal-organic complex solution including Ba: trifluoroacetate solution including Ba.
(c) Metal-organic complex solution including Cu: the solution which includes any one or more kinds of naphthenate, octylic acid salt, levulinic acid salt, neodecanoic acid salt including Cu.
(d) Metal-organic complex solution including the metal which has larger affinity for Ba: the solution which includes any one or more kinds of trifluoroacetate, naphthenate, octylic acid salt, levulinic acid salt, neodecanoic acid salt including the metal of at least one or more kinds which are selected from Zr, Ce, Sn or Ti.

The RE-type superconducting layer 2 is formed onto the second intermediate layer 1c. And it is preferable to give the heat treatment for forming the superconductor with the temperature range of 700 to 800 degrees C. in the atmosphere of 30-100 Torr of the water vapor partial pressure and 0.05-1 Torr of the oxygen partial pressure after the preliminary calcination heat-treatment of the temperature range of 400 to 500 degrees C. in the atmosphere of 3-76 Torr of the water vapor partial pressure and 300-760 Torr of the oxygen partial pressure.

Besides, it is effective that the intermediate heat treatment is given with the lower temperature than the heat treatment temperature for forming the superconductor between the above-mentioned preliminary calcination heat-treatment and the heat treatment for forming the superconductor. This reason is to prevent the occurrence of the cracks by discharging the remained organic component or the residual fluoride in the preliminary calcination before reaching the crystallization temperature, and to form the superconductor which has the thick film (refer to Japanese Patent Publication No. 2007-165153).

According to the knowledge of this time, in the feature of the MOD process that the TFA salt is the starting material, the superconductor is formed by the reaction between the precursor including fluoride and the water vapor in the crystallization heat-treatment, the crystal growth rate can be controlled by the water vapor partial pressure, and the growth rate of the superconducting phase increases along with the rise of the water vapor partial pressure. However, because the Jc of the YBCO superconducting film deteriorates rapidly by the occurrence of the cracks or the formation of the pores in the superconducting film when exceeding the critical water vapor partial pressure, the preliminary calcination heat-treatment and the heat treatment for forming the superconductor are given under the condition of the above-mentioned range.

On the other hand, the structure which is formed after the rapid decomposition and desorption of the organic component at the time of the temperature rise of the crystallization heat-treatment and which has a lot of pores and is rough becomes the origination of the local strain-stress at the time of the volume shrinkage of the film accompanied with the subsequent formation of the YBCO phase, and this causes the occurrence of the cracks. Therefore, the intermediate heat treatment is given.

However, from the result of the subsequent study, it became clear that the reduction of the Jc or the Ic was not caused by only the occurrence of the cracks, and that the origination of the local strain-stress which was the cause of the occurrence of the cracks was not caused by only the structure which had a lot of pores and was rough.

That is, among the metal elements which compose the RE-type (123) superconductor, especially, according to the condition of the preliminary calcination process, Ba does not disperse uniformly in the preliminary calcination film and it becomes easy to cause the segregation, and Ba becomes excess locally in the region that this segregation occur. Therefore, the Ba impurity is formed besides the RE-type (123) superconductor. In this Ba impurity, the precipitation occurs in the crystal grain boundary in almost cases, and from the result, because the impurity which is the dielectric intervenes in the crystal grain boundary, the electric connectivity among the crystal grain boundaries is damaged, and it becomes one of the causes which triggers the occurrence of the cracks. Consequently, it is considered as the cause that the Jc or the Ic deteriorates.

As described above, by reducing the molar ratio of Ba than the standard molar ratio, the segregation of Ba is restrained, and the precipitation of the impurities of Ba base in the crystal grain boundary is restrained. Consequently, the occurrence of the cracks is restrained, and the electric connectivity among the crystal grain boundaries improves and the Jc which is defined by the conducting current improves.

In this invention, as the method to introduce the magnetic flux pinning centers into the RE-type (123) oxide superconducting wire by TFA-MOD process, the method that such as the naphthenate including Zr which has higher affinity for Ba is mixed in the solution including TFA is adopted. And, by controlling the introduction amount, $BaZrO_3$ is formed by combining with Ba which is one of the causes of the deterioration of the Jc by the segregation of the grain boundary, and by dispersing these into the grain, the grain boundary characteristic is improved. Besides, $BaZrO_3$, $ZrO_2$ which are formed into the superconductor exist with nano size and nano interval in the direction of the film surface and the direction of the film thickness, and these pin the magnetic flux effectively, and it becomes possible that the anisotropy of the Jc for the applied magnetic field angle is improved remarkably. Besides, for controlling the size, the density and the dispersion of $BaZrO_3$, $ZrO_2$, it becomes possible by controlling the oxygen partial pressure, the water vapor partial pressure and the temperature of heat treatment at the time of the preliminary calcination heat-treatment and the. crystallization heat-treatment in addition to the introduction amount of such as the naphthenate including Zr. And, the introduction of the effective magnetic flux pinning centers become possible by conducting the optimization of these.

Hereinafter, the embodiment of this invention is explained.

EMBODIMENT

Embodiment,

As the substrate, the composite substrate that the first intermediate layer which comprised $Gd_2Zr_2O_7$ by IBAD process and the second intermediate layer which comprised $CeO_2$ by PLD process were formed sequentially on the hastelloy tape was used. The $\Delta\phi$ of the first intermediate layer and the second intermediate layer in this case were respectively 14 deg. and 4.5 deg.

On the other hand, The Y-TFA salt, the Sm-TFA salt, the Ba-TFA salt and the naphthenate of Cu were mixed in the organic solvent so that the molar ratio of Y:Sm:Ba:Cu became 0.77:0.23:1.5:3, and the raw material solution was made by mixing the naphthenate including Zr with the metallic molar ratio of 1% in this mixed solution.

The raw material solution was coated onto the second intermediate layer of the above-mentioned composite substrate, and subsequently, the preliminary calcination heat-treatment was given. The preliminary calcination heat-treatment was given by the furnace cooling after heating till 500 degrees C. of the maximum heating temperature (Tmax) in the atmosphere of the oxygen gas of the water vapor partial pressure of 16 Torr.

After the above-mentioned preliminary calcination heat-treatment, the heat treatment (crystallization heat-treatment) for formation of the superconductor was given and the superconducting film was formed onto the composite substrate. This heat treatment was given by the furnace cooling after maintaining the temperature of 760 degrees C. in the atmosphere of the argon gas of the water vapor partial pressure of 76 Torr and the oxygen partial pressure of 0.23 Torr.

The film thickness of the tape-shaped RE-type superconductor (YSmBCO+BZO) which was produced by the above-mentioned process was 0.8 μm.

Figure 1:
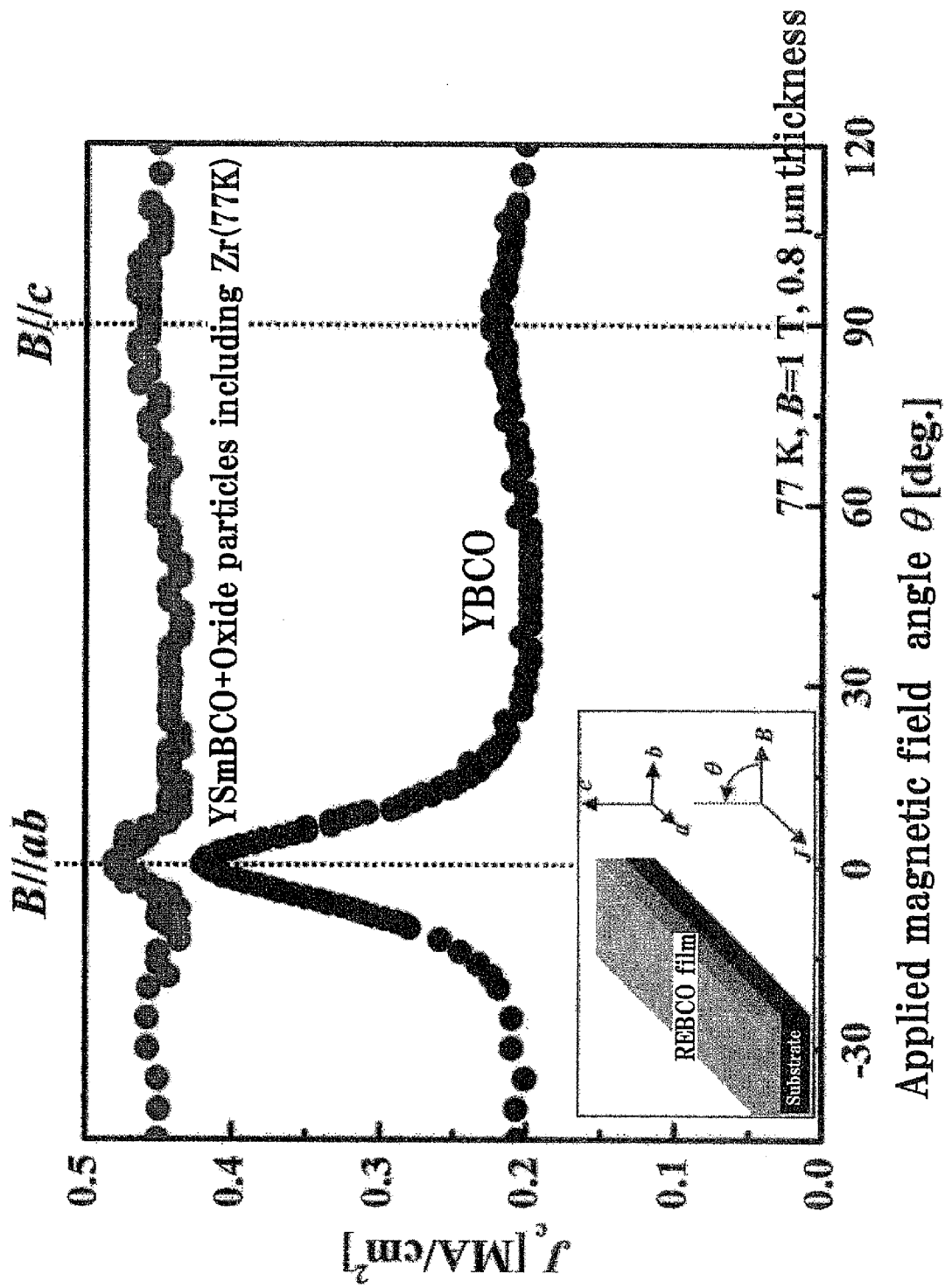
FIG. 1 The graph which shows the angular dependence for magnetic field of the superconductor which is produced by the embodiment and the comparative example of this invention.
Figure 2:
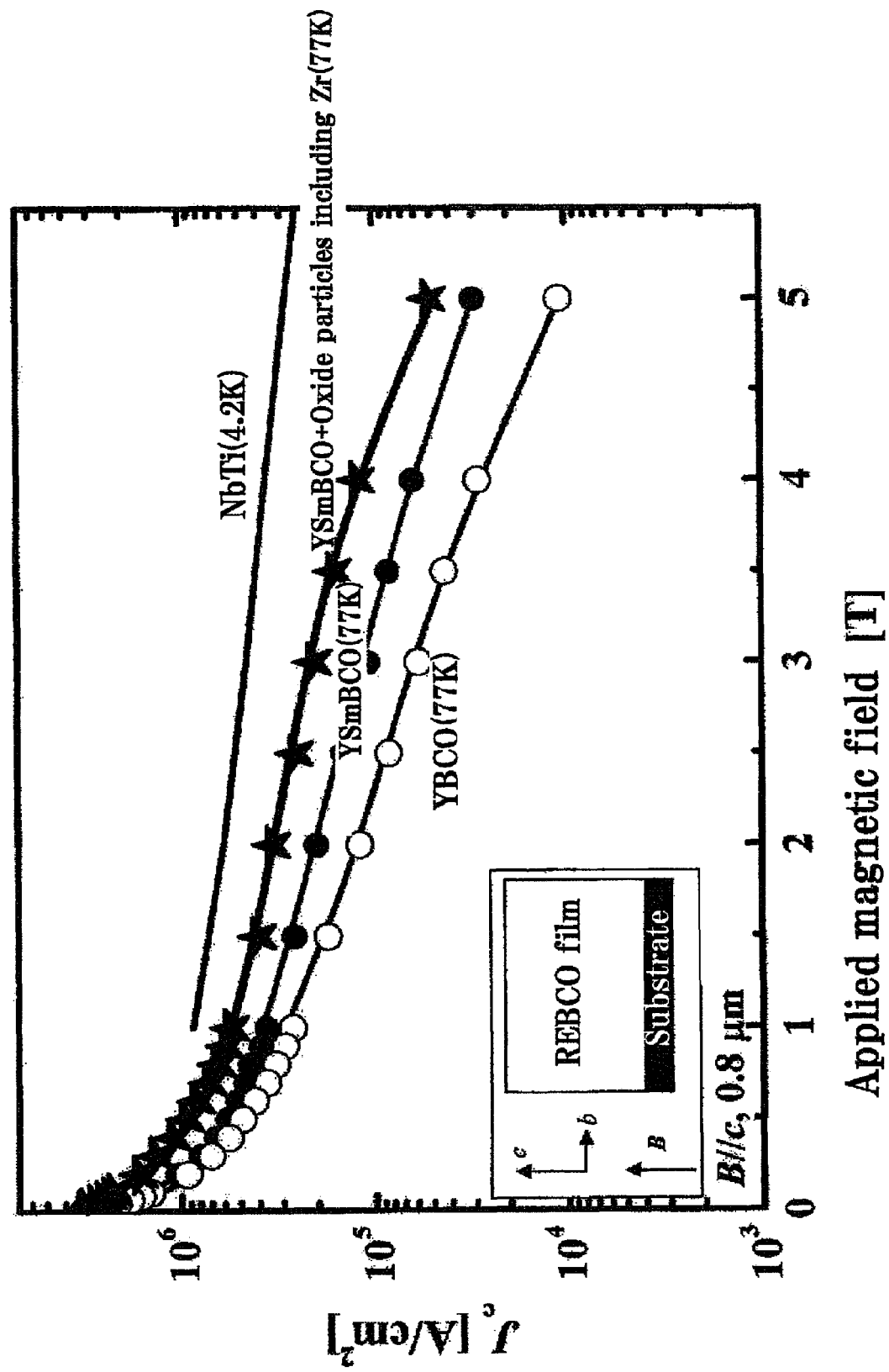
FIG. 2 The graph which shows the critical current value for the applied magnetic field of the superconductor which is produced by the embodiment and the comparative example of this invention.

Concerning the superconducting film which was obtained in this way, the angular dependence for magnetic field, that is, the Jc (77K) when the external magnetic field was applied to the parallel direction (perpendicular to the ab face) to the c axis and that value was changed was measured. The result is shown in FIG. 2. And, concerning this superconducting film, that angular dependence for magnetic field, that is, the Jc (77K) when the external magnetic field of 1 T was applied and the angle for the ab surface was changed was measured. The result is shown in FIG. 1. In FIG. 1, the angular dependence for magnetic field of the Jc was $Jc_{min}/Jc_{max}=0.91$.

Figure 3:
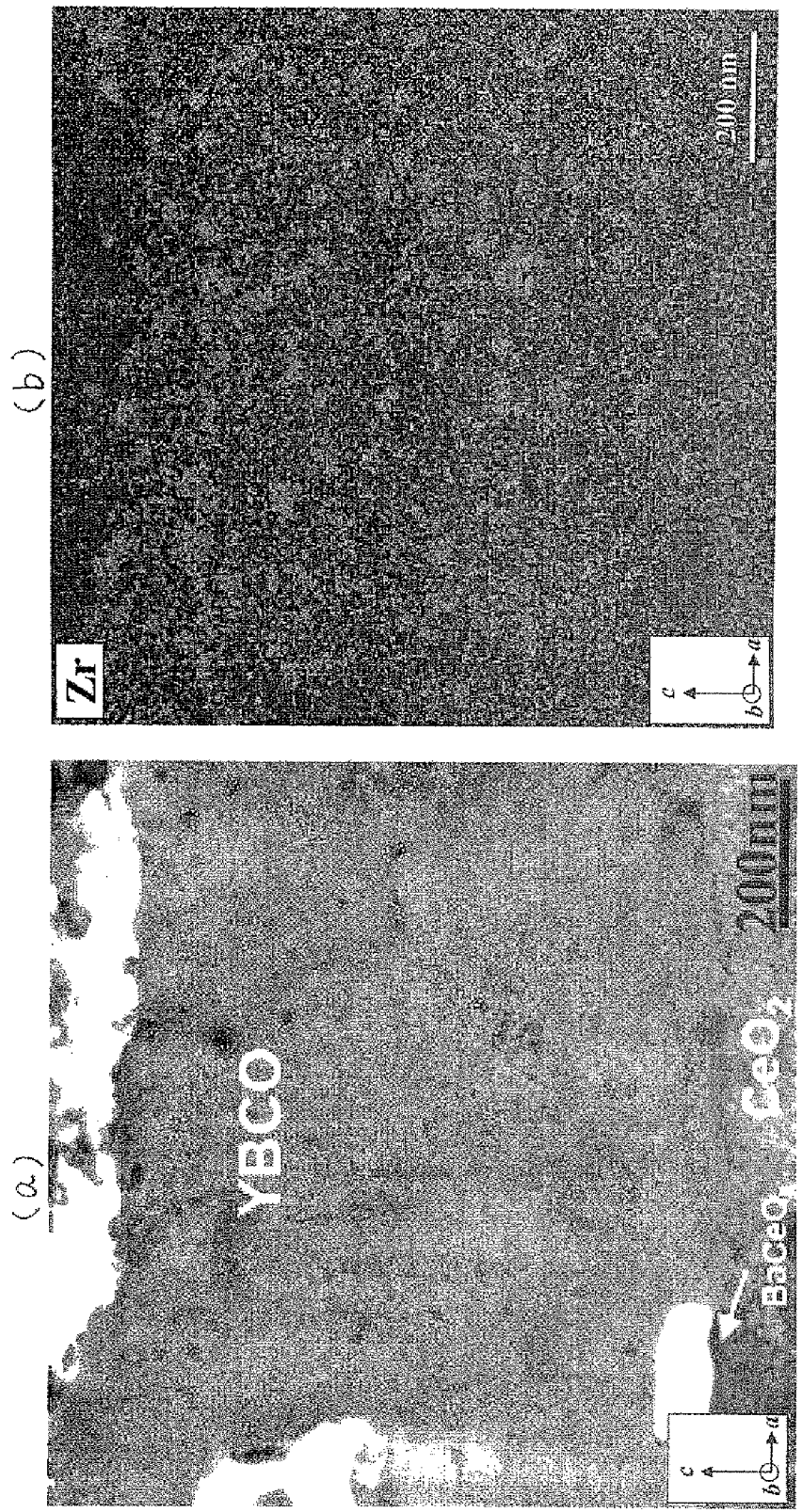
FIG. 3 The photograph which shows TEM image (a) and the material mapping (b) in the perpendicular cross section to the superconducting film of the superconductor which is produced by this invention.

Besides, TEM image in the perpendicular cross section to the superconducting film is shown in FIG. 3(a), and the material mapping is shown in FIG. 3(b).

The magnetic flux pinning centers at this time were $Sm_{1+x}Ba_{y=2-x}Cu_3O_z$ (low-Tc phase), $BaZrO_3$ and $ZrO_2$, and they were confirmed that $BaZrO_3$ and $ZrO_2$ of about 20 nm (5-25) dispersed uniformly to the direction of the film thickness with the interval of about 50 nm in the cross section of the superconducting film (parallel to the c axis).

Comparative Example 1

The composite substrate similar to the embodiment was used, and the raw material solution was made by mixing the Y-TFA salt, the Sm-TFA salt, the Ba-TFA salt and the naphthenate of Cu in the organic solvent so that the molar ratio of Y:Sm:Ba:Cu became 0.77:0.23:1.5:3.

The raw material solution was coated onto the second intermediate layer of the above-mentioned composite substrate, and subsequently, as well as the embodiment, the preliminary calcination heat-treatment and the heat treatment (crystallization heat-treatment) for formation of the superconductor were given, and the superconducting film was formed onto the composite substrate. The film thickness of the tape-shaped RE-type superconductor (YSmBCO) which was produced by the above-mentioned process was 0.8 μm.

Concerning the superconducting film which was obtained in this way, the magnetic field dependence property of the Jc was measured as well as the embodiment. The result is shown in FIG. 2. And, concerning this superconducting film, the angular dependence for magnetic field of the Jc was measured as well as the embodiment. The angular dependence for magnetic field of the Jc was $Jc_{,min}/Jc_{,max}=0.6$.

The magnetic flux pinning centers at this time were $Sm_{1+x}Ba_{y=2-x}Cu_3O_z$ (low-Tc phase), and was about 100 nm.

Comparative Example 2

The composite substrate similar to the embodiment was used, and the raw material solution was made by mixing the Y-TFA salt, the Ba-TFA salt and the naphthenate of Cu in the organic solvent so that the molar ratio of Y:Ba:Cu became 1:1.5:3.

The raw material solution was coated onto the second intermediate layer of the above-mentioned composite substrate, and subsequently, as well as the Embodiment, the preliminary calcination heat-treatment and the heat treatment (crystallization heat-treatment) for formation of the superconductor were given, and the superconducting film was formed onto the composite substrate. The film thickness of the tape-shaped RE-type superconductor (YBCO) which was produced by the above-mentioned process was 0.8 μm.

Concerning the superconducting film which was obtained in this way, the magnetic field dependence property of the Jc was measured as well as the embodiment. The result is shown in FIG. 2. And, concerning this superconducting film, the angular dependence for magnetic field of the Jc was measured as well as the embodiment. The result is shown in FIG. 1. In FIG. 1, the angular dependence for magnetic field of the Jc was $Jc_{,min}/Jc_{,max}=0.47$.

As is clear from the results of the above-mentioned embodiment and the comparative examples, in the tape-shaped RE-type superconductor (YSmBCO+oxide particle including Zr) by this invention, the magnetic field dependence property of the Jc is smaller compared with the tape-shaped RE-type superconductor (YSmBCO) of the comparative example 1 that a part of Y is substituted by Sm and the tape-shaped RE-type superconductor (YBCO) of the comparative example 2 whose Ba concentration is reduced than the standard composition, and the magnetic field characteristic which has the high Jc in the high magnetic field is shown.

Besides, when the external magnetic field (77K) of 1 T applied to the parallel direction (perpendicular to ab surface) to the c axis, (YSmBCO) of the comparative example 1 has the Jc of 1.3 times compared with the (YBCO) of the comparative example 2. However, (YSmBCO+oxide particle including Zr) of the embodiment has the Jc of 2.2 times compared with (YBCO) of the comparative example 2.

Further, whereas YBCO of the comparative example 2 and YSmBCO of the comparative example 1 are respectively 0.47 and 0.6 and show the anisotropy, the angular dependence for magnetic field ($Jc_{,min}/Jc_{,max}$) of (YSmBCO+oxide particle including Zr) of the embodiment also improves remarkably with 0.91.

That is, according to this invention, in the RE-type superconductor whose Ba concentration is reduced, by dispersing the magnetic flux pinning centers ($BaZrO_3$ and oxide including Zr such as $ZrO_2$) artificially and finely, the Jc which is comparable to the NbTi alloy superconductor can be obtained in 77K, 1 T, and the magnetic flux can be pinned effectively for also the every direction of the magnetic field. Therefore, the Jc-B-θ characteristic can be improved and the isotropic Jc characteristic can be obtained.

Industrial Applicability

According to this invention, because the anisotropy of the Jc under the high magnetic field and the Jc for the applied magnetic field angle of the RE-type oxide superconducting wire which is suitable to TFA-MOD process which is the low cost process in the non-vacuum improves remarkably, the application to the superconducting apparatus such as the superconducting magnet, the superconducting transformer or the superconducting magnetic energy storage is possible.

The invention claimed is:

1. A RE-type oxide superconducting wire comprising a $REBa_yCu_3O_z$-type superconductor which is formed on an intermediate layer formed onto a substrate, wherein
    said RE comprises an element selected from the group consisting of Y, Nd, Sm, Gd and Eu,
    y is <2, and
    oxide particles of 50 nm or less including Zr are dispersed as magnetic flux pinning centers in said superconductor.

2. A RE-type oxide superconducting wire comprising a $REBa_yCu_3O_z$-type superconductor which is formed on an intermediate layer formed onto a substrate, wherein
    said RE has a composition of $RE=A_{1-x}B_x$,
    wherein each of A and B is at least one element selected from the group consisting of Y, Nd, Sm, Gd and Eu,
    y is <2, and
    oxide particles of 50 nm or less including Zr are dispersed as magnetic flux pinning centers in said superconductor.

3. A RE-type oxide superconducting wire comprising a $REBa_yCu_3O_z$-type superconductor which is formed on an intermediate layer formed onto a substrate, wherein
    said RE is $Y_{1-x}Sm_x$,
    y is <2, and
    oxide particles including Sm and oxide particles of 50 nm or less including Zr are dispersed as magnetic flux pinning centers into said superconductor.

4. The RE-type oxide superconducting wire according to claim 1, wherein
    1.3<y<1.8.

5. The RE-type oxide superconducting wire according to claim 1, wherein
    the oxide particles are 5-30 nm.

6. The RE-type oxide superconducting wire according to claim 3, wherein
the oxide particles are 5-30 nm.
7. The RE-type oxide superconducting wire according to claim 1, wherein
the amount of Zr is 0.5-10 mole % of the metal content.
8. The RE-type oxide superconducting wire according to claim 7, wherein
the amount of Zr is 0.5-5 mole % of the metal content.
9. A process for producing a RE-type oxide comprising a step of forming a $REBa_yCu_3O_z$-type superconductor by a preliminary calcination heat-treatment after coating a raw material solution on an intermediate layer formed on a substrate, and subsequently heating to form a superconductor, wherein
the raw material solution is a mixed solution which comprises (1) a metal-organic complex solution including RE (wherein RE is a metal element selected from the group consisting of Y, Nd, Sm, Gd and Eu), Ba and Cu, and (2) a metal-organic complex solution including one or more metals selected from the group consisting of Zr, Ce, Sn and Ti
y is <2, and
oxide particles of 50 nm or less including Zr, Ce, Sn or Ti are dispersed as magnetic flux pinning centers in said superconductor.
10. A process for producing a RE-type oxide superconducting wire comprising a step of forming a $REBa_yCu_3O_z$-type superconductor by a preliminary calcination heat-treatment after coating a raw material solution on the intermediate layer formed on a substrate, and subsequently heating to form a superconductor, wherein
the raw material solution is a mixed solution which comprises (1) a metal-organic complex solution including RE (wherein RE is $RE=A_{1-x}B_x$ and A and B are elements selected from the group consisting of Y, Nd, Sm, Gd and Eu), Ba and Cu, and (2) a metal-organic complex solution including at least one metal selected from the group consisting of Zr, Ce, Sn and Ti,
y is <2, and
oxide particles of 50 nm or less including Zr, Ce, Sn or Ti are dispersed as magnetic flux pinning centers in said superconductor.
11. A process for producing a RE-type oxide superconducting wire comprising a step of forming a $REBa_yCu_3O_z$-type superconductor by a preliminary calcination heat-treatment after coating a raw material solution after coating a raw material solution on an intermediate layer formed on a substrate, and subsequently heating to form a superconductor, wherein
the raw material solution is a mixed solution which comprises (1) a metal-organic complex solution including RE (wherein RE is $Y_{1-x}Sm_x$), Ba and Cu, and (2) a metal-organic complex solution including at least one metal selected from the group consisting of Zr, Ce, Sn and Ti which has a larger affinity for Ba is used as said raw material solution,
y is <2, and
first oxide particles including Sm and second oxide particles of 50 nm or less including Zr, Ce, Sn or Ti are dispersed as magnetic flux pinning centers in said superconductor.
12. The process for producing the RE-type oxide superconducting wire according to claim 11, wherein
1.3<y<1.8.
13. The process for producing the RE-type oxide superconducting wire according to claim 9, wherein
the magnetic flux pinning centers are the second oxide particles and wherein the second oxide particles include Zr and are 5-30 nm.
14. The process for producing the RE-type oxide superconducting wire according to claim 11, wherein
the magnetic flux pinning centers are the first oxide particles including Sm and the second oxide particles including Zr of 5-30 nm.
15. The process for producing the RE-type oxide superconducting wire according to claim 11, wherein
the amount of Zr is 0.5-10 mole % of the metal content.
16. The process for producing the RE-type oxide superconducting wire according to claim 11, wherein
the amount of Zr is 0.5-5 mole % of the metal content.
17. The process for producing the RE-type oxide superconducting wire according to claim 11, wherein
the metal-organic complex solution (1) comprises an organic solvent and one or more RE compounds selected from trifluoroacetate (TFA salt), naphthenate, octylic acid salt, levulinic acid salt and neodecanoic acid salt.
18. The process for producing the RE-type oxide superconducting wire according to claim 11, wherein
the metal-organic complex solution including Ba comprises an organic solvent and a trifluoroacetate (TFA), salt of Ba.
19. The process for producing the RE-type oxide superconducting wire according to claim 11, wherein
the metal-organic complex solution (1) comprises an organic solvent and one or more Cu compounds selected from naphthenate, octylic acid salt, levulinic acid salt and neodecanoic acid salt.
20. The process for producing the RE-type oxide superconducting wire according to claim 11, wherein
the metal-organic complex solution (2) comprises an organic solvent and one or more Zr compounds of trifluoroacetate (TFA salt), naphthenate, octylic acid salt, levulinic acid salt and neodecanoic acid salt.
21. The process for producing the RE-type oxide superconducting wire according to claim 11, wherein
the metal-organic complex solution (2) comprises an organic solvent and one or more trifluoroacetate (TFA salt), naphthenate, octylic acid salt, levulinic acid salt, and neodecanoic acid salt of at least one metal selected from Ce, Sn and Ti.
22. The process for producing the RE-type oxide superconducting wire according to claim 11, wherein
the preliminary calcination heat-treatment is at a temperature of 400-500 degrees C.
23. The process for producing the RE-type oxide superconducting wire according to claim 22, wherein
the preliminary calcination heat-treatment is in an atmosphere of a water vapor partial pressure of 3-76 Torr and an oxygen partial pressure of 300-760 Torr.
24. The process for producing the RE-type oxide superconducting wire according to claim 11, wherein
the heat treatment for formation of the superconductor is at a temperature of 700 to 800 degrees C.
25. The process for producing the RE-type oxide superconducting wire according to claim 24, wherein
the heat treatment for formation of the superconductor is in an atmosphere of a water vapor partial pressure of 30-100 Torr and an oxygen partial pressure of 0.05-1 Torr.
26. The process for producing the RE-type oxide superconducting wire according to claim 9, wherein
1.3<y<1.8.

27. The process for producing the RE-type oxide superconducting wire according to claim 10, wherein
the magnetic flux pinning centers are the second oxide particles and wherein the second oxide particles include Zr and are 5-30 nm.

28. The process for producing the RE-type oxide superconducting wire according to claim 9, wherein
the amount of Zr is 0.5-10 mole % of the metal content.

29. The process for producing the RE-type oxide superconducting wire according to claim 9, wherein
the metal-organic complex solution (1) comprises an organic solvent and one or more RE compounds selected from trifluoroacetate (TFA salt), naphthenate, octylic acid salt, levulinic acid salt and neodecanoic acid salt.

30. The process for producing the RE-type oxide superconducting wire according to claim 9, wherein
the metal-organic complex solution including Ba comprises an organic solvent and a trifluoroacetate (TFA) salt of Ba.

31. The process for producing the RE-type oxide superconducting wire according to claim 9, wherein
the metal-organic complex solution (1) comprises an organic solvent and one or more Cu compounds selected from naphthenate, octylic acid salt, levulinic acid salt and neodecanoic acid salt.

32. The process for producing the RE-type oxide superconducting wire according to claim 9, wherein
the metal-organic complex solution (2) comprises an organic solvent and one or more Zr compounds of trifluoroacetate (TFA salt), naphthenate, octylic acid salt levulinic acid salt and neodecanoic acid salt.

33. The process for producing the RE-type oxide superconducting wire according to claim 9, wherein
the metal-organic complex solution (2) comprises an organic solvent and one or more of trifluoroacetate (TFA salt), naphthenate, octylic acid salt, levulinic acid salt and neodecanoic acid salt of at least one metal selected from Ce, Sn or Ti.

34. The process for producing the RE-type oxide superconducting wire according to claim 9, wherein
the preliminary calcination heat-treatment is at a temperature of 400-500 degrees C.

35. The process for producing the RE-type oxide superconducting wire according to claim 34, wherein
the preliminary calcination heat-treatment is in an atmosphere of a water vapor partial pressure of 3-76 Torr and an oxygen partial pressure of 300-760 Torr.

36. The process for producing the RE-type oxide superconducting wire according to claim 9, wherein
the heat treatment for formation of the superconductor is at a temperature of 700 to 800 degrees C.

37. The process for producing the RE-type oxide superconducting wire according to claim 36, wherein
the heat treatment for formation of the superconductor is in an atmosphere of a water vapor partial pressure of 30-100 Torr and an oxygen partial pressure of 0.05-1 Torr.

38. The process for producing the RE-type oxide superconducting wire according to claim 10, wherein
$1.3 < y < 1.8$.

39. The process for producing the RE-type oxide superconducting wire according to claim 10, wherein
the amount of Zr is 0.5-10 mole % of the metal content.

40. The process for producing the RE-type oxide superconducting wire according to claim 10, wherein
the metal-organic complex solution (1) comprises an organic solvent and one or more RE compounds selected from trifluoroacetate (TFA salt), naphthenate, octylic acid salt, levulinic acid salt and neodecanoic acid salt.

41. The process for producing the RE-type oxide superconducting wire according to claim 10, wherein
the metal-organic complex solution including Ba comprises an organic solvent and a trifluoroacetate (TFA) salt of Ba.

42. The process for producing the RE-type oxide superconducting wire according to claim 10, wherein
the metal-organic complex solution (1) comprises an organic solvent and one or more Cu compounds selected from naphthenate, octylic acid salt, levulinic acid salt and neodecanoic acid salt.

43. The process for producing the RE-type oxide superconducting wire according to claim 10, wherein
the metal-organic complex solution (2) comprises an organic solvent and one or more Zr compounds of trifluoroacetate (TFA salt), naphthenate, octylic acid salt levulinic acid salt and neodecanoic acid salt.

44. The process for producing the RE-type oxide superconducting wire according to claim 10, wherein
the metal-organic complex solution (2) comprises an organic solvent and one or more of trifluoroacetate (TFA salt), naphthenate, octylic acid salt, levulinic acid salt and neodecanoic acid salt of at least one metal selected from Ce, Sn or Ti.

45. The process for producing the RE-type oxide superconducting wire according to claim 10, wherein
the preliminary calcination heat-treatment is at a temperature of 400-500 degrees C.

46. The process for producing the RE-type oxide superconducting wire according to claim 10, wherein
the preliminary calcination heat-treatment is in an atmosphere of a water vapor partial pressure of 3-76 Torr and an oxygen partial pressure of 300-760 Torr.

47. The process for producing the RE-type oxide superconducting wire according to claim 10, wherein
the heat treatment for formation of the superconductor is at a temperature of 700 to 800 degrees C.

48. The process for producing the RE-type oxide superconducting wire according to claim 10, wherein
$1.3 < y < 1.8$.

* * * * *